US009620516B2

(12) United States Patent
Ramkumar et al.

(10) Patent No.: US 9,620,516 B2
(45) Date of Patent: *Apr. 11, 2017

(54) EMBEDDED SONOS BASED MEMORY CELLS

(71) Applicant: Cypress Semiconductor Corporation, San Jose, CA (US)

(72) Inventors: Krishnaswamy Ramkumar, San Jose, CA (US); Igor G. Kouznetsov, San Francisco, CA (US); Venkatraman Prabhakar, Pleasanton, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/146,753

(22) Filed: May 4, 2016

(65) Prior Publication Data

US 2016/0260730 A1   Sep. 8, 2016

Related U.S. Application Data

(63) Continuation of application No. 14/451,341, filed on Aug. 4, 2014, now Pat. No. 9,356,035, which is a
(Continued)

(51) Int. Cl.
*H01L 27/115*   (2006.01)
*H01L 27/11568*   (2017.01)
(Continued)

(52) U.S. Cl.
CPC .............. *H01L 27/11568* (2013.01); *H01L 21/823462* (2013.01); *H01L 27/088* (2013.01);
(Continued)

(58) Field of Classification Search
CPC ............. H01L 27/11568; H01L 29/792; H01L 29/167; H01L 29/668; H01L 29/7845
(Continued)

(56) References Cited

U.S. PATENT DOCUMENTS 6,251,744 B1 *  6/2001  Su .................... H01L 21/76213
                                                         257/E21.556
6,946,349 B1 *  9/2005  Lee ................. H01L 21/823462
                                                         257/E21.625
(Continued)

OTHER PUBLICATIONS

C. T. Swift, "An Embedded 90nm SONOS Nonvolatile Memory Utilizing Hot Electron Programming and Uniform Tunnel Erase", Embedded Memory Center, Motorolahttp://www.freescale.com/files/technology_manufacturing/doc/IEDM_2002_CRAIG_SWIFT_SONOS.pdf. 4 pages.
(Continued)

*Primary Examiner* — Earl Taylor

(57) ABSTRACT

Memory devices and methods for forming the same are disclosed. In one embodiment, the device includes a nonvolatile memory (NVM) transistor formed in a first region of a substrate, the NVM transistor comprising a channel and a gate stack on the substrate overlying the channel. The gate stack includes a dielectric layer on the substrate, a charge-trapping layer on the dielectric layer, an oxide layer overlying the charge-trapping layer, a first gate overlying the oxide layer, and a first silicide region overlying the first gate. The device includes a metal-oxide-semiconductor transistor formed in a second region of the substrate comprising a gate oxide overlying the substrate in the second region, a second gate overlying the gate oxide, and a second silicide region overlying the second gate. A strain inducing structure overlies at least the NVM transistor and a surface of the substrate in the first region of the substrate.

20 Claims, 11 Drawing Sheets

Related U.S. Application Data continuation of application No. 14/018,026, filed on Sep. 4, 2013, now Pat. No. 8,796,098.

(60) Provisional application No. 61/769,693, filed on Feb. 26, 2013, provisional application No. 61/825,196, filed on May 20, 2013.

(51) Int. Cl.

| | |
|---|---|
| *H01L 29/66* | (2006.01) |
| *H01L 29/792* | (2006.01) |
| *H01L 27/11573* | (2017.01) |
| *H01L 29/167* | (2006.01) |
| *H01L 29/423* | (2006.01) |
| *H01L 29/49* | (2006.01) |
| *H01L 29/51* | (2006.01) |
| *H01L 27/1157* | (2017.01) |
| *H01L 21/8234* | (2006.01) |
| *H01L 27/088* | (2006.01) |
| *H01L 29/78* | (2006.01) |

(52) U.S. Cl.
CPC .... *H01L 27/1157* (2013.01); *H01L 27/11573* (2013.01); *H01L 29/167* (2013.01); *H01L 29/42344* (2013.01); *H01L 29/42348* (2013.01); *H01L 29/495* (2013.01); *H01L 29/4916* (2013.01); *H01L 29/4966* (2013.01); *H01L 29/513* (2013.01); *H01L 29/517* (2013.01); *H01L 29/518* (2013.01); *H01L 29/66833* (2013.01); *H01L 29/7843* (2013.01); *H01L 29/792* (2013.01)

(58) Field of Classification Search
USPC .................................................. 257/392, 393
See application file for complete search history.

(56) References Cited

U.S. PATENT DOCUMENTS

| | | | | |
|---|---|---|---|---|
| 6,949,787 B2* | 9/2005 | Snyder | ............... | H01L 29/7839 257/310 |
| 7,390,718 B2* | 6/2008 | Roizin | ................ | H01L 27/105 257/E21.645 |
| 7,504,704 B2* | 3/2009 | Currie | ............... | H01L 21/76224 257/19 |
| 7,514,323 B2* | 4/2009 | Dobuzinsky | ...... | H01L 21/26586 257/330 |
| 7,651,915 B2* | 1/2010 | Yan | ...................... | H01L 27/105 257/E21.179 |
| 7,666,703 B2* | 2/2010 | Rhodes | ............ | H01L 27/14609 257/E27.132 |
| 7,678,662 B2* | 3/2010 | Arghavani | ............ | H01L 27/105 438/257 |
| 7,811,887 B2* | 10/2010 | Irani | ................. | H01L 21/76232 257/E21.409 |
| 7,816,728 B2* | 10/2010 | Ho | ....................... | H01L 27/115 257/324 |
| 7,825,444 B2* | 11/2010 | Rhodes | ............ | H01L 27/14609 257/292 |
| 7,939,863 B2* | 5/2011 | Hao | ................... | H01L 21/76264 257/262 |
| 7,972,929 B2* | 7/2011 | Lee | ...................... | H01L 27/105 257/500 |
| 8,022,459 B2* | 9/2011 | Snyder | .............. | H01L 21/28167 257/310 |
| 8,071,453 B1* | 12/2011 | Ramkumar | ........ | H01L 27/11568 438/197 |
| 8,093,128 B2* | 1/2012 | Koutny, Jr. | ........ | H01L 21/82341 257/324 |
| 8,120,095 B2* | 2/2012 | Ho | .................... | H01L 27/11565 257/327 |
| 8,158,478 B2* | 4/2012 | Yan | ....................... | H01L 27/105 257/E21.179 |
| 8,236,709 B2* | 8/2012 | Domenicucci | ........ | H01L 21/324 257/E21.317 |
| 8,409,950 B1* | 4/2013 | Shea | ............... | H01L 21/823456 257/E21.679 |
| 8,502,299 B2* | 8/2013 | Yan | ....................... | H01L 27/105 257/316 |
| 8,796,098 B1* | 8/2014 | Ramkumar | ....... | H01L 29/66833 257/324 |
| 8,861,271 B1* | 10/2014 | Zain | ......................... | G11C 8/20 365/154 |
| 9,356,035 B2* | 5/2016 | Ramkumar | ....... | H01L 29/66833 |
| 2004/0110390 A1* | 6/2004 | Takagi | ................... | H01L 27/105 438/710 |
| 2005/0205859 A1* | 9/2005 | Currie | ............... | H01L 21/76224 257/19 |
| 2006/0158538 A1* | 7/2006 | Rhodes | ............. | H01L 27/14609 348/294 |
| 2007/0087503 A1* | 4/2007 | Lusky | ............... | H01L 21/28282 438/257 |
| 2007/0132054 A1* | 6/2007 | Arghavani | ............ | H01L 27/105 257/506 |
| 2008/0090350 A1* | 4/2008 | Yan | ....................... | H01L 27/105 438/257 |
| 2008/0293207 A1* | 11/2008 | Koutny, Jr. | ...... | H01L 21/823412 438/306 |
| 2008/0296661 A1* | 12/2008 | Ramkumar | ..... | H01L 21/823412 257/324 |
| 2008/0296664 A1* | 12/2008 | Ramkumar | ..... | H01L 21/823412 257/326 |
| 2008/0296693 A1* | 12/2008 | Richter | ............... | H01L 29/7843 257/368 |
| 2009/0086548 A1* | 4/2009 | Wu | ..................... | G11C 16/0475 365/185.28 |
| 2009/0104780 A1* | 4/2009 | Lee | ....................... | H01L 27/105 438/703 |
| 2009/0179254 A1* | 7/2009 | Van Schaijk | .......... | G11C 16/14 257/324 |
| 2010/0032771 A1* | 2/2010 | Snyder | .............. | H01L 21/82341 257/382 |
| 2010/0096685 A1* | 4/2010 | Yan | ....................... | H01L 27/105 257/316 |
| 2011/0027956 A1* | 2/2011 | Domenicucci | ........ | H01L 21/324 438/301 |
| 2011/0175160 A1* | 7/2011 | Snyder | .............. | H01L 21/82341 257/329 |
| 2012/0115292 A1* | 5/2012 | Smith | ............... | H01L 21/28282 438/200 |
| 2012/0126305 A1* | 5/2012 | Yan | ....................... | H01L 27/105 257/316 |
| 2013/0092989 A1* | 4/2013 | Ting | ........................ | H01L 29/78 257/296 |
| 2013/0178031 A1* | 7/2013 | Ramkumar | ..... | H01L 21/823412 438/287 |
| 2014/0239374 A1* | 8/2014 | Ramkumar | ....... | H01L 29/66833 257/324 |
| 2015/0041881 A1* | 2/2015 | Ramkumar | ....... | H01L 29/66833 257/324 |

OTHER PUBLICATIONS

Everspin Technologies, "Comparing nvSRAM with Everspin MRAM", Home Page: www.everspin.com/Document No. EST-1015Rev. 0 May 29, 2009. 3 pages.

Kim, J.H.,"Highly manufacturable SONOS non-volatile memory for the embedded SoC solution", VLSI Technology, 2003. Digest of Technical Papers. 2003 Symposium on Jun. 10-12, 2003; 31-32 pages.

Krishnaswamy Ramkumar, "Cypress SONOS Technology", Cypress Semiconductor White Paper, Sep. 10, 2013; 13 pages.

Lee et al., Indium doped nMOSFET's and Buried Channel pMOSFETs with n+ Polysilicon Gate, Japan Journal of Applied Physics, vol. 36, 1997, pp. 1341-1345.

(56) References Cited

OTHER PUBLICATIONS

Shahidi et al., Indium Channel Implant for Improved Short-Channel Behavior of Submicrometer NMOSFET's, IEEE Electron Device Letters, vol. 141, No. 8, 1993, pp. 409-411.
USPTO Advisory Action for U.S. Appl. No. 14/451,341 dated Jul. 28, 2015; 3 pages.
USPTO Final Rejection for U.S. Appl. No. 14/451,341 dated Jun. 2, 2015; 26 pages.
USPTO Non Final Rejection for U.S. Appl. No. 14/018,026 dated Feb. 14, 2014; 13 pages.
USPTO Non-Final Rejection for U.S. Appl. No. 14/451,341 dated Jan. 6, 2015; 23 pages.
USPTO Non-Final Rejection for U.S. Appl. No. 14/451,341 dated Sep. 11, 2015; 24 pages.
USPTO Notice of Allowance for U.S. Appl. No. 14/018,026 dated May 15, 2014; 8 pages.
USPTO Notice of Allowance for U.S. Appl. No. 14/451,341 dated Jan. 26, 2016; 8 pages.

\* cited by examiner

EMBEDDED SONOS BASED MEMORY CELLS

CROSS-REFERENCE TO RELATED APPLICATIONS

This application is a continuation of U.S. patent application Ser. No. 14/451,341, filed Aug. 4, 2014 which is a continuation of U.S. patent application Ser. No. 14/018,026, filed Sep. 4, 2013, now U.S. Pat. No. 8,796,098 which claims priority to U.S. Provisional Patent Application No. 61/769,693, filed Feb. 26, 2013, and to U.S. Provisional Patent Application No. 61/825,196, filed May 20, 2013, all of which are incorporated by reference herein in their entirety.

TECHNICAL FIELD

The present disclosure relates generally to semiconductor devices, and more particularly to memory cells including embedded or integrally formed SONOS based non-volatile memory (NVM) transistors and metal-oxide-semiconductor (MOS) transistors and methods for fabricating the same.

BACKGROUND

For many applications, such as system-on-chip, it is desirable to integrate logic devices and interface circuits based upon metal-oxide-semiconductor (MOS) field-effect transistors and non-volatile memory (NVM) transistors on a single chip or substrate. This integration can seriously impact both the MOS transistor and NVM transistor fabrication processes. MOS transistors are typically fabricated using a standard or baseline complimentary-metal-oxide-semiconductor (CMOS) process flows, involving the formation and patterning of conducting, semiconducting and dielectric materials. The composition of these materials, as well as the composition and concentration of processing reagents, and temperature used in such a CMOS process flow are stringently controlled for each operation to ensure the resultant MOS transistors will function properly.

Non-volatile memory devices include non-volatile memory transistors, silicon-oxide-nitride-oxide-semiconductor (SONOS) based transistors, including charge-trapping gate stacks in which a stored or trapped charge changes a threshold voltage of the non-volatile memory transistor to store information as a logic 1 or 0. Charge-trapping gate stack formation involves the formation of a nitride or oxynitride charge-trapping layer sandwiched between two dielectric or oxide layers typically fabricated using materials and processes that differ significantly from those of the baseline CMOS process flow, and which can detrimentally impact or be impacted by the fabrication of the MOS transistors. In particular, forming a gate oxide or dielectric of a MOS transistor can significantly degrade performance of a previously formed charge-trapping gate stack by altering a thickness or composition of the charge-trapping layer. In addition, this integration can seriously impact the baseline CMOS process flow, and generally requires a substantial number of mask sets and process steps, which add to the expense of fabricating the devices and can reduce yield of working devices.

BRIEF DESCRIPTION OF THE DRAWINGS

The present invention will be understood more fully from the detailed description that follows and from the accompanying drawings and the appended claims provided below, where:

DETAILED DESCRIPTION

Embodiments of a memory cell including an embedded non-volatile memory (NVM) transistor and a metal-oxide-semiconductor (MOS) transistor and methods of fabricating the same are described herein with reference to figures. However, particular embodiments may be practiced without one or more of these specific details, or in combination with other known methods, materials, and apparatuses. In the following description, numerous specific details are set forth, such as specific materials, dimensions and processes parameters etc. to provide a thorough understanding of the present invention. In other instances, well-known semiconductor design and fabrication techniques have not been described in particular detail to avoid unnecessarily obscuring the present invention. Reference throughout this specification to "an embodiment" means that a particular feature, structure, material, or characteristic described in connection with the embodiment is included in at least one embodiment of the invention. Thus, the appearances of the phrase "in an embodiment" in various places throughout this specification are not necessarily referring to the same embodiment of the invention. Furthermore, the particular features, structures, materials, or characteristics may be combined in any suitable manner in one or more embodiments.

The terms "over," "under," "between," and "on" as used herein refer to a relative position of one layer with respect to other layers. As such, for example, one layer deposited or disposed over or under another layer may be directly in contact with the other layer or may have one or more intervening layers. Moreover, one layer deposited or disposed between layers may be directly in contact with the layers or may have one or more intervening layers. In contrast, a first layer "on" a second layer is in contact with that second layer. Additionally, the relative position of one layer with respect to other layers is provided assuming operations deposit, modify and remove films relative to a starting substrate without consideration of the absolute orientation of the substrate.

The NVM transistor may include memory transistors or devices implemented using Silicon-Oxide-Nitride-Oxide-Silicon (SONOS) or floating gate technology.

Figure 1:
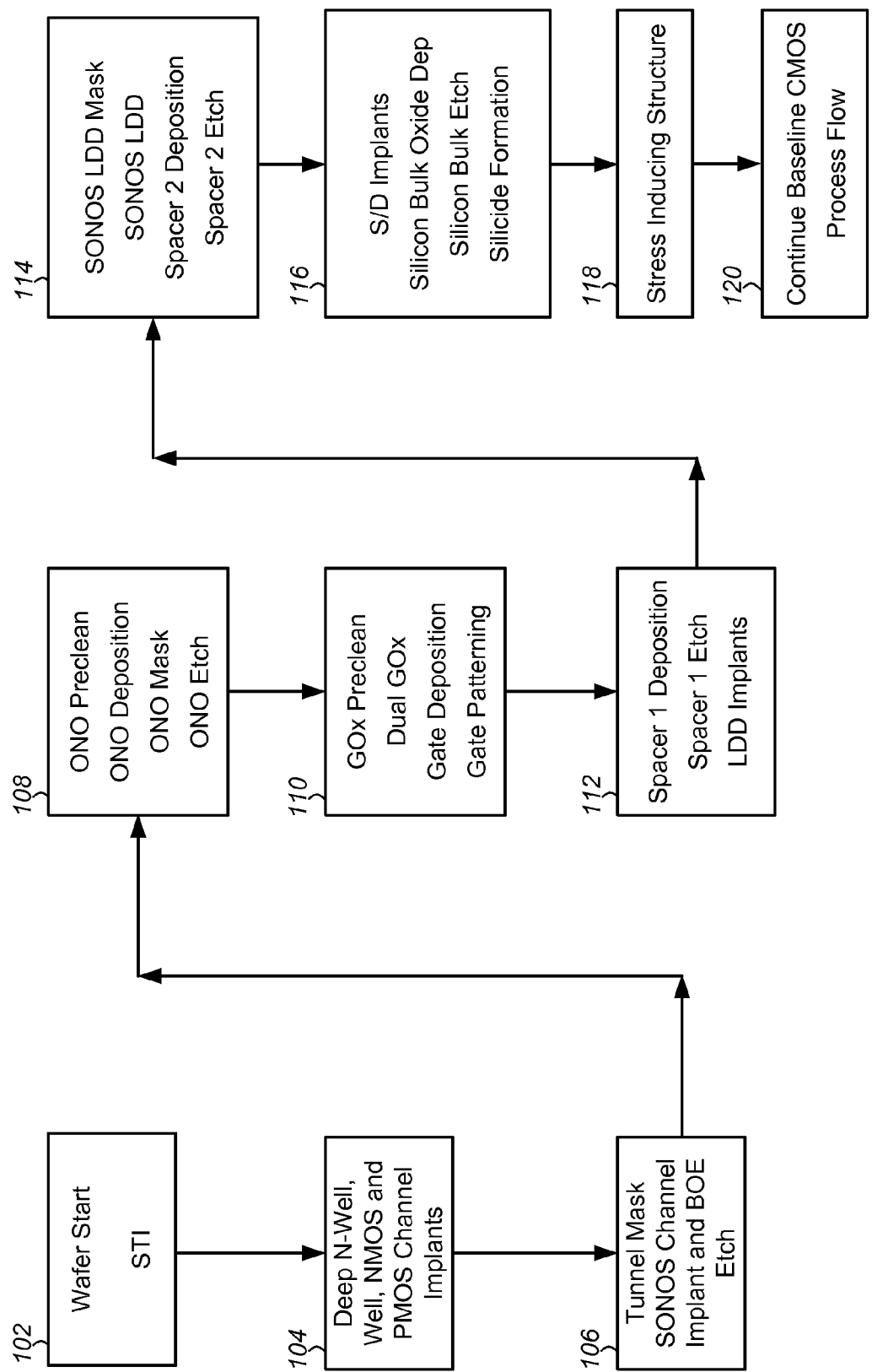
FIG. 1 is a flowchart illustrating an embodiment of a method for fabricating a memory cell including an embedded silicon-oxide-nitride-oxide-semiconductor (SONOS) based non-volatile memory (NVM) transistor and metal-oxide-semiconductor (MOS) transistors.

An embodiment of a method for integrating or embedding a NVM transistor into a standard or baseline CMOS process flow for fabricating one or more MOS transistors will now be described in detail with reference to FIG. 1 and FIGS. 2A through 2M. FIG. 1 is a flowchart illustrating an embodiment of a method or process flow for fabricating the memory cell. FIGS. 2A-2L are block diagrams illustrating cross-sectional views of a portion of a memory cell during fabrication of the memory cell according to the method of FIG. 1, and FIG. 2M is a block diagram illustrating a cross-sectional view of a portion of an embodiment of the finished memory cell.

Figure 2A:
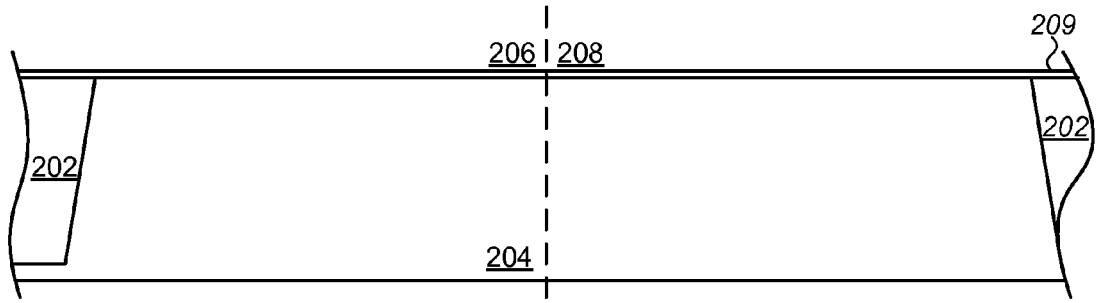
FIGS. 2A-2M are block diagrams illustrating cross-sectional views of a portion of a memory cell during fabrication of the memory cell according to the method of FIG. 1.

Referring to FIG. 1 and FIG. 2A, the process begins with forming a number of isolation structures 202 in a wafer or substrate 204 (step 102). The isolation structures 202 isolate the memory cell being formed from memory cells formed in adjoining areas (not shown) of the substrate 204 and/or isolate the NVM transistor being formed in a first region 206 of the substrate from one or more of the MOS transistors transistor being formed in a second region 208. The isolation structures 202 include a dielectric material, such as an oxide or nitride, and may be formed by any conventional technique, including but not limited to shallow trench isolation (STI) or local oxidation of silicon (LOCOS). The substrate 204 may be a bulk wafer composed of any single crystal material suitable for semiconductor device fabrication, or may include a top epitaxial layer of a suitable material formed on a substrate. Suitable materials include, but are not limited to, silicon, germanium, silicon-germanium or a III-V compound semiconductor material.

Generally, as in the embodiment shown, a pad oxide 209 is formed over a surface 216 of the substrate 204 in both the first region 206 and the second region 208. The pad oxide 209 can be silicon dioxide ($SiO_2$) having a thickness of from about 10 nanometers (nm) to about 20 nm and can be grown by a thermal oxidation process or in-situ steam generation (ISSG).

Figure 2B:
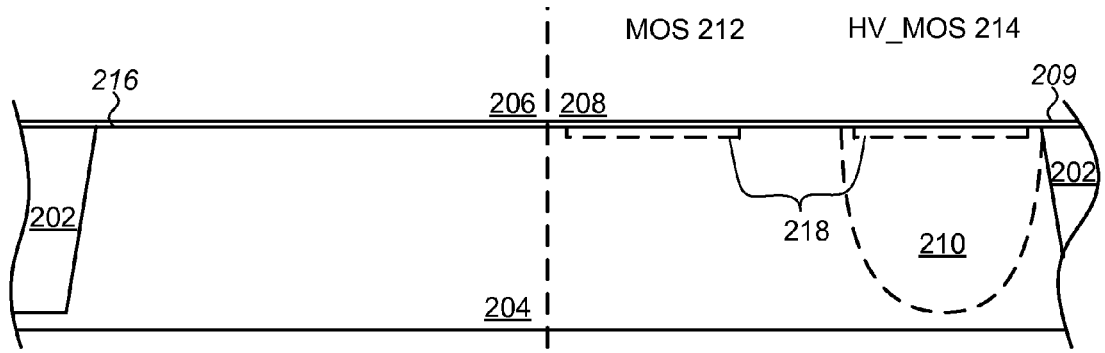

Referring to FIG. 1 and FIG. 2B, dopants are then implanted into substrate 204 through the pad oxide 209 to form wells in which the NVM transistor and/or the MOS transistors will be formed, and channels for the MOS transistors (step 104). The dopants implanted may be of any type and concentration, and may be implanted at any energy, including energies necessary to form wells or deep wells for the NVM transistor and/or the MOS transistors, and to form channels for the MOS transistors. In a particular embodiment illustrated in FIG. 2B, dopants of an appropriate ion species are implanted to form a deep N-well 210 in the second region 208 over or in which a high-voltage (HV) MOS transistor 214, such as a MOS input/output (110) transistor, will be formed. Although not shown, it is to be appreciated that the wells or deep wells can also be formed for the NVM transistor and/or a standard or low-voltage (LV) MOS transistor, such as a MOS transistor 212. It is further to be appreciated that the wells are formed by depositing and patterning a mask layer, such as a photoresist layer above the surface 216 of the substrate 204, and implanting an appropriate ion species at an appropriate energy to an appropriate concentration.

Channels 218 for one or more of the MOS transistors 214, 212, are formed in the second region 208 of the substrate 204. As with the well implant the channels 218 are formed by depositing and patterning a mask layer, such as a photoresist layer above the surface 216 of the substrate 204, and implanting an appropriate ion species at an appropriate energy to an appropriate concentration. For example, $BF_2$ can be implanted at an energy of from about 10 to about 100 kilo-electron volts (keV), and a dose of from about 1e12 $cm^{-2}$ to about 1e14 $cm^{-2}$ to form an N-type MOS (NMOS) transistor. A P-type MOS (PMOS) transistor may likewise be formed by implantation of Arsenic or Phosphorous ions at any suitable dose and energy. It is to be appreciated that implantation can be used to form channels 218, in both of the MOS transistors 214, 212, at the same time, or at separate times using standard lithographic techniques, including a patterned photoresist layer to mask one of the channels for the MOS transistors.

Figure 2C:
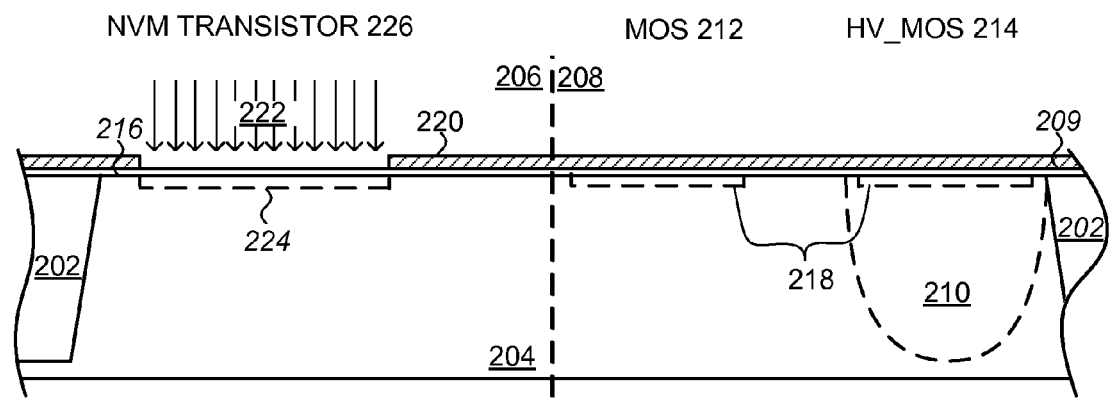

Next, referring to FIG. 1 and FIG. 2C a patterned tunnel mask 220 is formed on or overlying the pad oxide 209, ions (represented by arrows 222) of an appropriate, energy and concentration are implanted through a window or opening in the tunnel mask to form a channel 224 for a NVM transistor 226, and the tunnel mask and the pad oxide in at least the second region 208 removed (step 106). The tunnel mask can include a photoresist layer, or a hard mask formed, from a patterned nitride or silicon-nitride layer.

In one embodiment, the channel 224 for the NVM transistor 226 is an Indium doped channel implanted with Iridium (In) at an energy of from about 50 to about 500 kilo-electron volts (keV), and a dose of from about 5e11 $cm^{-2}$ to about 5e12 $cm^{-2}$ to form a n-channel NVM transistor. As explained in greater detail below, implanting Indium to form the channel 224 of the NVM transistor 226 improves the threshold voltage ($V_T$) uniformity of the NVM transistor from a sigma of $V_T$ from about 150 millivolts (mV) to about 70 to 80 mV. Alternatively, $BF_2$ can be implanted to form an n-channel NVM transistor, or Arsenic or Phosphorous implanted to form a p-channel NVM transistor.

A photoresist tunnel mask 220 can be ashed or stripped using oxygen plasma. A hard mask can be removed using a wet or dry etch process. The pad oxide 209 is removed, for example in a wet clean process using a 10:1 buffered oxide etch (BOE) containing a surfactant. Alternatively, the wet clean process can be performed using a 20:1 BOE wet etch, a 50:1 hydrofluoric (HF) wet etch, a pad etch, or any other similar hydrofluoric-based wet etching chemistry.

Referring to FIG. 1 and FIGS. 2D-2F, the surface 204 of the substrate 204 is cleaned or precleaned, a number of dielectric layers, such as oxide-nitride-oxide or ONO layers, formed or deposited, a mask formed on or overlying the dielectric layers, and the dielectric layers etched to form a dielectric gate stack 236 in the first region 206 (step 108). The preclean can be a wet or dry process and in this embodiment is wet process using HF or standard cleans (SC1) and SC2, and is highly selective to the material of the substrate 204. SC1 is typically performed using a 1:1:5 solution of ammonium hydroxide ($NH_4OH$), hydrogen peroxide ($H_2O_2$) and water ($H_2O$) at 50 to 80° C. for about 10 minutes. SC2 is a short immersion in a 1:1:10 solution of HCl, H2O2 and $H_2O$ at about 50 to 80° C.

Figure 2D:
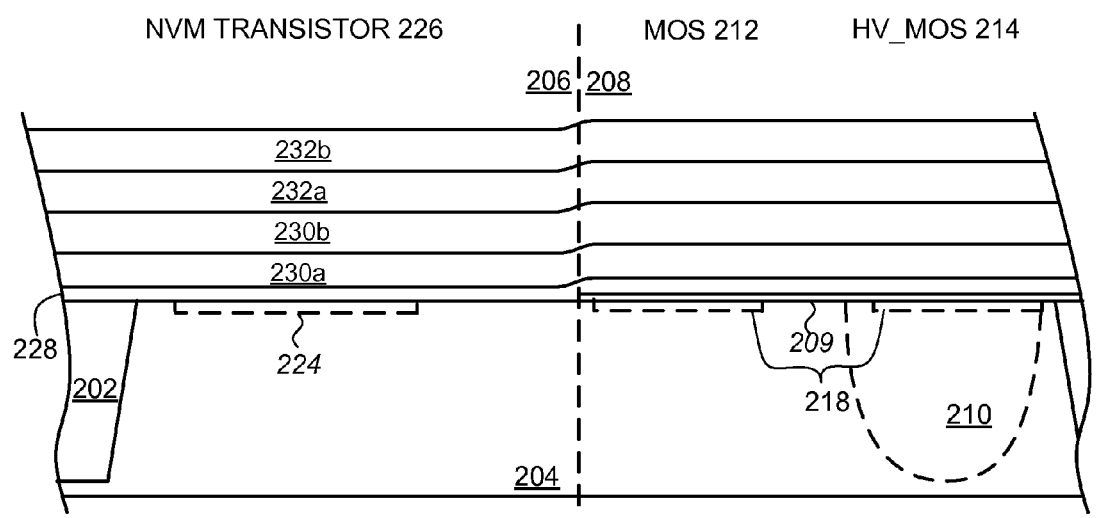

Referring to FIG. 2D, the dielectric or ONO deposition begins with the formation of a tunnel dielectric 228 over at least the channel 224 of the NVM transistor 226 in the first region 206 of the substrate 204. The tunnel dielectric 228 may be any material and have any thickness suitable to allow charge carriers to tunnel into an overlying charge-trapping layer under an applied gate bias while maintaining a suitable barrier to leakage when the NVM transistor is unbiased. In certain embodiments, tunnel dielectric 228 is silicon dioxide, silicon oxy-nitride, or a combination thereof and can be grown by a thermal oxidation process, using ISSG or radical oxidation.

In one embodiment a silicon dioxide tunnel dielectric 228 may be thermally grown in a thermal oxidation process. For example, a layer of silicon dioxide may be grown utilizing dry oxidation at 750 degrees centigrade (° C.)—800° C. in an oxygen containing gas or atmosphere, such as oxygen ($O_2$) gas. The thermal oxidation process is carried out for a duration approximately in the range of 50 to 150 minutes to effect growth of a tunnel dielectric 228 having a thickness of from about 1.0 nanometers (nm) to about 3.0 nm by oxidation and consumption of the exposed surface of substrate.

In another embodiment a silicon dioxide tunnel dielectric 228 may be grown in a radical oxidation process involving flowing hydrogen ($H_2$) and oxygen ($O_2$) gas into a processing chamber at a ratio to one another of approximately 1:1 without an ignition event, such as forming of a plasma, which would otherwise typically be used to pyrolyze the $H_2$ and $O_2$ to form steam. Instead, the $H_2$ and $O_2$ are permitted to react at a temperature approximately in the range of about 900° C. to about 1000° C. at a pressure approximately in the range of about 0.5 to about 5 Torr to form radicals, such as, an OH radical, an $HO_2$ radical or an O diradical, at the surface of substrate. The radical oxidation process is carried out for a duration approximately in the range of about 1 to about 10 minutes to effect growth of a tunnel dielectric 228 having a thickness of from about 1.0 nanometers (nm) to about 4.0 nm by oxidation and consumption of the exposed surface of substrate. It will be understood that in this and in subsequent figures the thickness of tunnel dielectric 228 is exaggerated relative to the pad oxide 209, which is approximately 7 times thicker, for the purposes of clarity. A tunnel dielectric 228 grown in a radical oxidation process is both denser and is composed of substantially fewer hydrogen atoms/cm$^3$ than a tunnel dielectric formed by wet oxidation techniques, even at a reduced thickness. In certain embodiments, the radical oxidation process is carried out in a batch-processing chamber or furnace capable of processing multiple substrates to provide a high quality tunnel dielectric 228 without impacting the throughput (wafers/hr.) requirements that a fabrication facility may require.

In another embodiment, tunnel dielectric layer 228 is deposited by chemical vapor deposition (CVD) or atomic layer deposition and is composed of a dielectric layer which may include, but is not limited to silicon dioxide, silicon oxy-nitride, silicon nitride, aluminum oxide, hafnium oxide, zirconium oxide, hafnium silicate, zirconium silicate, hafnium oxy-nitride, hafnium zirconium oxide and lanthanum oxide. In another embodiment, tunnel dielectric 228 is a bi-layer dielectric region including a bottom layer of a material such as, but not limited to, silicon dioxide or silicon oxy-nitride and a top layer of a material which may include, but is not limited to silicon nitride, aluminum oxide, hafnium oxide, zirconium oxide, hafnium silicate, zirconium silicate, hafnium oxy-nitride, hafnium zirconium oxide and lanthanum oxide.

Referring again to FIG. 2D, a charge-trapping layer is formed on or overlying the tunnel dielectric 228. Generally, as in the embodiment shown, the charge-trapping layer is a multi-layer charge-trapping layer comprising multiple layers including at least a lower or first charge-trapping layer 230a closer to the tunnel dielectric 228, and an upper or second charge-trapping layer 230b that is oxygen-lean relative to the first charge-trapping layer and comprises a majority of a charge traps distributed in multi-layer charge-trapping layer.

The first charge-trapping layer 230a of a multi-layer charge-trapping layer 230 can include a silicon nitride ($Si_3N_4$), silicon-rich silicon nitride or a silicon oxy-nitride ($SiO_xN_y(H_z)$). For example, the first charge-trapping layer 230a can include a silicon oxynitride layer having a thickness of between about 2.0 nm and about 4.0 nm formed by a CVD process using dichlorosilane (DCS)/ammonia ($NH_3$) and nitrous oxide ($N_2O$)/$NH_3$ gas mixtures in ratios and at flow rates tailored to provide a silicon-rich and oxygen-rich oxynitride layer.

The second charge-trapping layer 230b of the multi-layer charge-trapping layer is then formed over the first charge-trapping layer 230a. The second charge-trapping layer 230b can include a silicon nitride and silicon oxy-nitride layer having a stoichiometric composition of oxygen, nitrogen and/or silicon different from that of the first charge-trapping layer 230a. The second charge-trapping layer 230b can include a silicon oxynitride layer having a thickness of between about 2.0 nm and about 5.0 nm, and may be formed or deposited by a CVD process using a process gas including DCS/$NH_3$ and $N_2O$/$NH_3$ gas mixtures in ratios and at flow rates tailored to provide a silicon-rich, oxygen-lean top nitride layer.

As used herein, the terms "oxygen-rich" and "silicon-rich" are relative to a stoichiometric silicon nitride, or "nitride," commonly employed in the art having a composition of ($Si_3N_4$) and with a refractive index (RI) of approximately 2.0. Thus, "oxygen-rich" silicon oxynitride entails a shift from stoichiometric silicon nitride toward a higher wt. % of silicon and oxygen (i.e. reduction of nitrogen). An oxygen rich silicon oxynitride film is therefore more like silicon dioxide and the RI is reduced toward the 1.45 RI of pure silicon dioxide. Similarly, films described herein as "silicon-rich" entail a shift from stoichiometric silicon nitride toward a higher wt. % of silicon with less oxygen than an "oxygen-rich" film. A silicon-rich silicon oxynitride film is therefore more like silicon and the RI is increased toward the 3.5 RI of pure silicon.

Referring again to FIG. 2D, the number of dielectric layers further includes a cap layer 232 that is formed on or overlying the charge-trapping layer 230. In one embodiment, the cap layer 232 includes a silicon nitride all or part of which is subsequently oxidized to form a blocking oxide overlying the charge-trapping layer 230. The cap layer 232 can be a single layer of nitride (not shown) having a homogeneous composition, a single layer of nitride having a gradient in stoichiometric composition, or, as in the embodiment shown, can be a multi-layer cap layer including at least a lower or first cap layer 232a overlying the second charge-trapping layer 230b, and a second cap layer 232b overlying the first cap layer 232a.

In one embodiment, the first cap layer 232a can include a silicon nitride, a silicon-rich silicon nitride or a silicon-rich silicon oxynitride layer having a thickness of between 2.0 nm and 4.0 nm formed by a CVD process using $N_2O$/$NH_3$ and DCS/$NH_3$ gas mixtures. Similarly, the second cap layer 232b can also include a silicon nitride, a silicon-rich silicon nitride or a silicon-rich silicon oxynitride layer having a thickness of between 2.0 nm and 4.0 nm formed by a CVD process using $N_2O$/$NH_3$ and DCS/$NH_3$ gas mixtures. Optionally, the first cap layer 232a and second cap layer 232b can comprise different stoichiometries. For example, the second cap layer 232b can comprise a silicon or oxygen rich composition relative to the first cap layer 232a to facilitate removal of the second cap layer in a dry or wet clean process prior to oxidizing the first cap layer. Alternatively, the first cap layer 232a can comprise a silicon or oxygen rich composition relative to the second cap layer 232b to facilitate oxidation of the first cap layer.

Figure 2E:
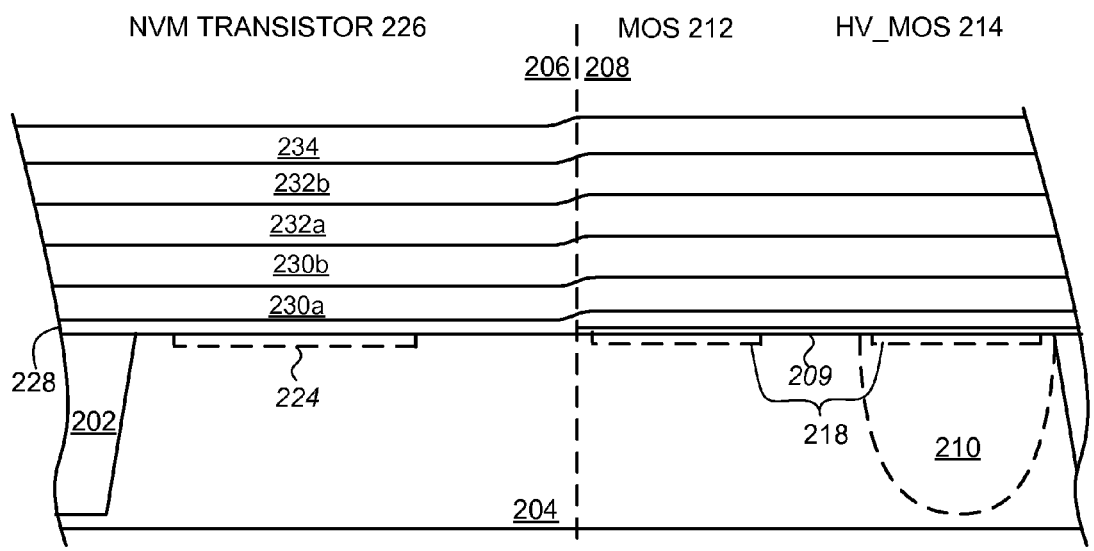

Referring to FIG. 2E, a sacrificial oxide layer 234 is formed on or overlying the second cap layer 232b. In one embodiment, the sacrificial oxide layer 234 can include a silicon dioxide layer grown by a thermal oxidation process, in-situ steam generation (ISSG), or radical oxidation, and having a thickness of between 2.0 nm and 4.0 nm. In another embodiment, the sacrificial oxide layer 234 can be formed or deposited by a chemical vapor deposition process in a low pressure chemical vapor deposition (LPCVD) chamber. For example, the sacrificial oxide layer 234 can be deposited by a CVD process using a process gas including gas mixtures of silane or DCS and an oxygen containing gas, such as $O_2$ or $N_2O$, in ratios and at flow rates tailored to provide a silicon dioxide ($SiO_2$) sacrificial oxide layer.

Figure 2F:
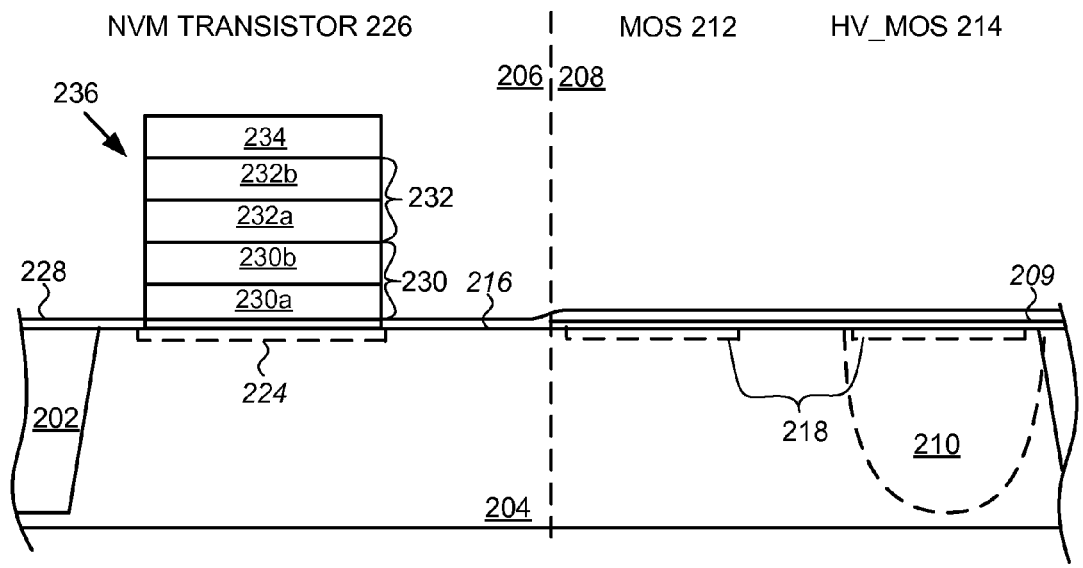

Next, referring to FIG. 2F, a patterned mask layer (not shown) is formed on or overlying the sacrificial oxide layer 234, and the sacrificial oxide, cap layer 232, and the charge-trapping layer 230 etched or patterned to form a gate stack 236 overlying the channel 224 of the NVM transistor and to remove the sacrificial oxide, cap layer, and the charge trapping layers 230 from the second region 208 of the substrate 204. The patterned mask layer can include a photoresist layer patterned using standard lithographic techniques, and the sacrificial oxide layer 234, cap layer 232, and the charge trapping layers 230 from can be etched or removed using a dry etch process including one or more separate steps to stop on the surface 216 of the substrate 204.

Figure 2G:
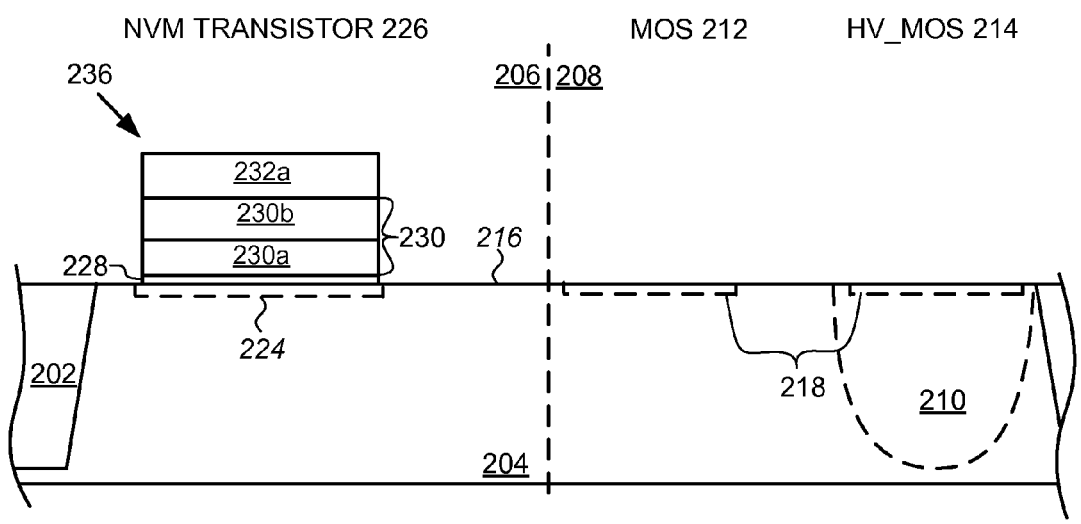

Referring to FIG. 1, a gate oxide or GOX preclean is performed, gate oxides for both MOS transistors 214, 212 formed, and a gate layer is deposited and patterned to form gates for the NVM transistor 226, and both MOS transistors (step 110). Referring to FIG. 2G, the GOX preclean removes the sacrificial oxide layer 234 and a portion of the cap layer 232 or substantially of all of a top most layer in a multi-layer cap layer are removed from the gate stack 236 in a highly selective cleaning process. This cleaning process simultaneously or concurrently further removes any oxide, such as an oxide tunnel dielectric 228 and pad oxide 209, remaining in the first region 206 outside the gate stack 236 and in the second region 208 to prepare the substrate 204 in that region for gate oxide growth. The thickness of the cap layer 232 is adjusted to allow a portion or substantially all of the second cap layer 232b to be consumed by the GOX preclean. In one exemplary implementation the sacrificial oxide layer 234 and the second cap layer 232b are removed in a wet clean process using a 10:1 buffered oxide etch (BOE) containing a surfactant. Alternatively, the wet clean process can be performed using a 20:1 BOE wet etch, a 50:1 hydrofluoric (HF) wet etch, a pad etch, or any other similar hydrofluoric-based wet etching chemistry.

This embodiment of the GOX preclean is advantageous in that it substantially does not affect the baseline CMOS process—either in the preclean step (step 110) or a subsequent oxidation step (step 112), but rather uses it for the integration of the NVM transistor fabrication.

Figure 2H:
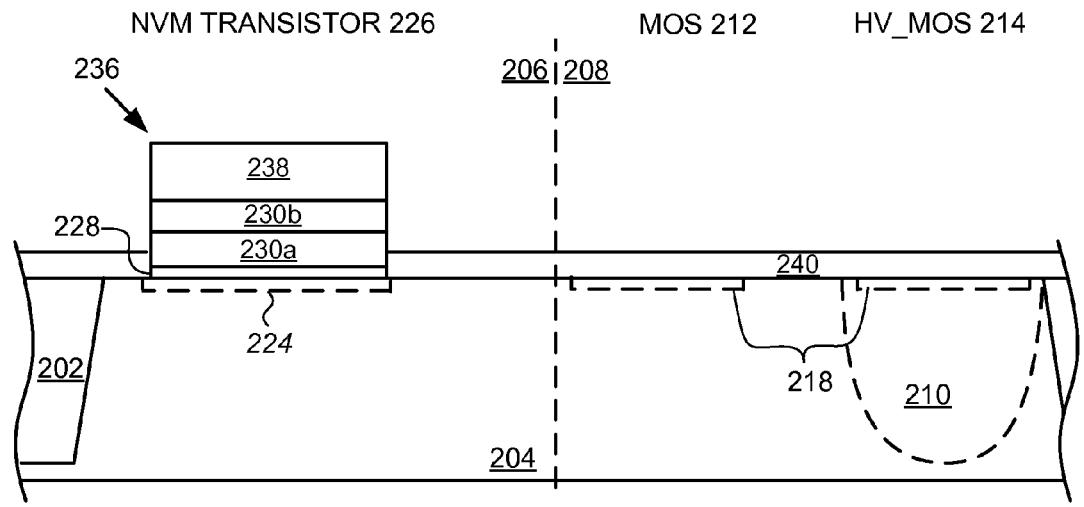

Next, referring to FIG. 2H, an oxidation process is performed to oxidize the remaining portion of the cap layer 232 or the first cap layer 232a of a multi-layer cap layer, and a portion of the second charge-trapping layer 230b to form a blocking oxide layer 238 overlying the second charge-trapping layer. In one embodiment, the oxidation process is adapted to oxidize the first cap layer 232a to form the blocking oxide layer 238 while simultaneously or concurrently oxidizing at least a portion of the surface 216 of the substrate 204 in the second region 208 to form a first gate oxide 240 overlying at least the channel 218 of at least one MOS transistor. The oxidation process can include in-situ-steam-generation (ISSG), CVD, or radical oxidation performed in a batch or single substrate processing chamber with or without an ignition event such as plasma. For example, in one embodiment the blocking oxide layer 238 and the gate oxide 240 may be grown in a radical oxidation process involving flowing hydrogen ($H_2$) and oxygen ($O_2$) gas into a processing chamber at a ratio to one another of approximately 1:1 without an ignition event, such as forming of a plasma, which would otherwise typically be used to pyrolyze the $H_2$ and $O_2$ to form steam. Instead, the $H_2$ and $O_2$ are permitted to react at a temperature approximately in the range of 700-800° C. at a pressure approximately in the range of 0.5-5 Torr to form radicals, such as, an OH radical, an $HO_2$ radical or an O diradical radicals at a surface of the cap layer 232 or the first cap layer 232a. The oxidation process is carried out for a duration approximately in the range of 1-5 minutes for a single substrate using an ISSG process, or 10-15 minutes for a batch furnace process to effect growth of a blocking oxide layer 238 by oxidation and consumption of the first cap layer 232a and a portion of the second charge-trapping layer 230b having a thickness of from about 3 nm to about 4.5 nm, and gate oxide 240 having a thickness of from about 5 nm to about 7 nm.

Figure 2I:
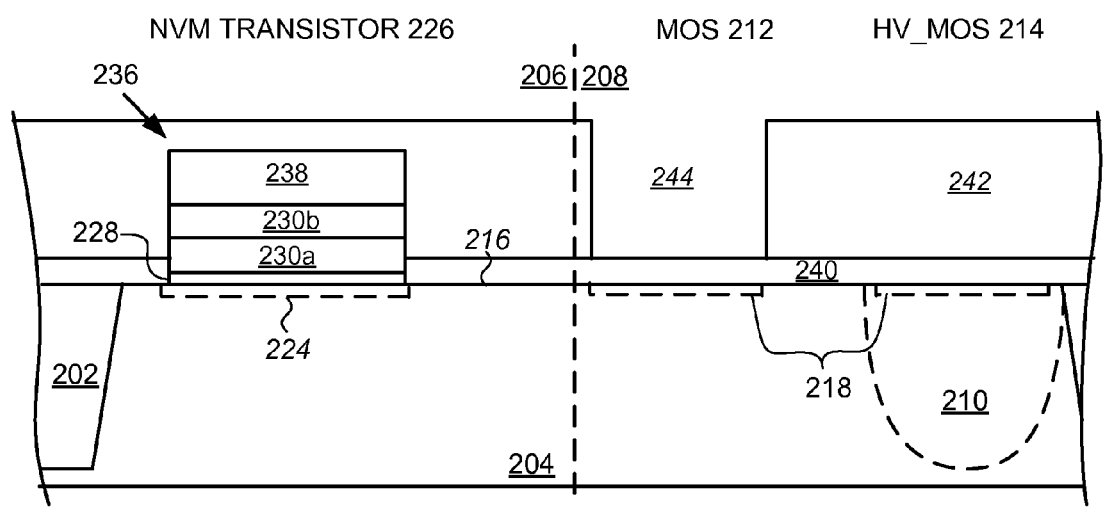

In some embodiments, such as that shown in FIGS. 2I to 2L, the method further includes a dual gate oxide process flow to enable fabrication of both a LV MOS transistor 212 and a HV MOS transistor 214. Referring to FIG. 2I, a patterned mask layer 242 is formed over the first and second regions 206, 208 of the substrate 204. The patterned mask layer 242 can be a photoresist layer patterned using standard lithographic techniques, and includes at least one opening 244 over a channel 218 in the second region 208. The thick, first gate oxide 240 is etched in the exposed regions by using a BOE etch, under conditions similar to those described above with respect to removing the sacrificial oxide layer 234, and the patterned mask layer 242 is then removed.

Figure 2J:
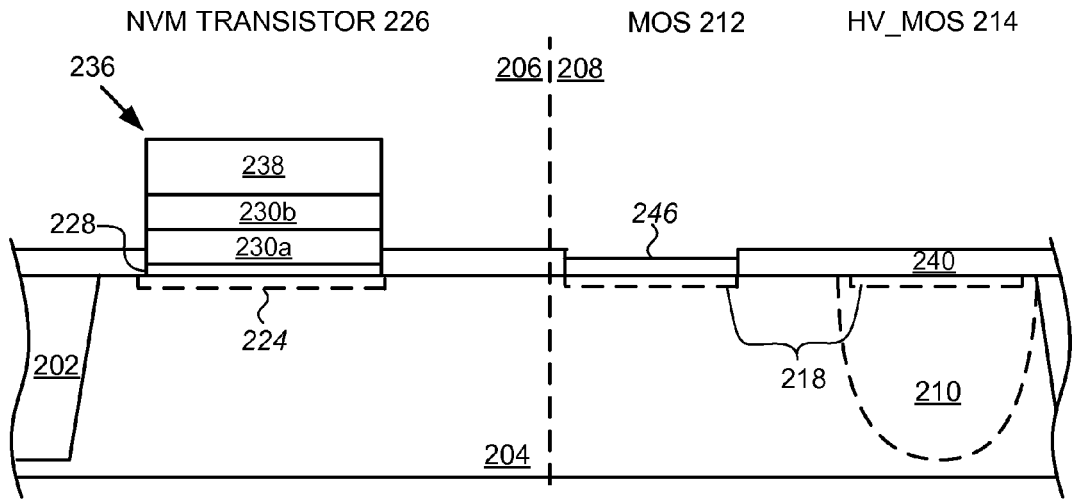

Referring to FIG. 2J, the substrate 206 is cleaned using a wet etch that does not etch oxide in order to protect the first gate oxide 240 of the HV MOS transistor 212, and the blocking oxide layer 238 of the gate stack 236. The substrate 206 is then subjected to a thermal oxidation process to grow a thin, second gate oxide 246 having a thickness from about 1 nm to about 3 nm. In some embodiments, the second gate oxide 246 can be overlaid with a deposited layer (not shown) such as silicon oxy-nitride, silicon nitride, aluminum oxide, hafnium oxide, zirconium oxide, hafnium silicate, zirconium silicate, hafnium oxy-nitride, hafnium zirconium oxide and lanthanum oxide.

Figure 2K:
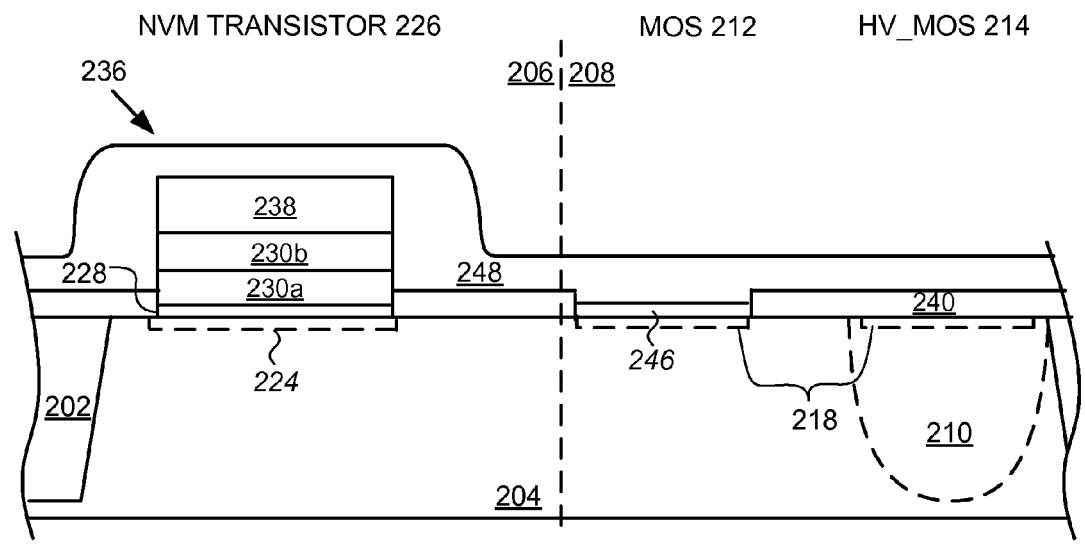

Referring to FIG. 2K, a gate layer 248 of any conducting or semiconducting material suitable for accommodating a biasing of the NVM transistor 226 and operation of the MOS transistors 214, 212, is formed over the gate stack 236, the first gate oxide 240 of the HV MOS transistor 214, and the second gate oxide 246 of the MOS transistor 212. In one embodiment, the gate layer is formed by physical vapor deposition and is composed of a metal-containing material which may include, but is not limited to, metal nitrides, metal carbides, metal silicides, hafnium, zirconium, titanium, tantalum, aluminum, ruthenium, palladium, platinum, cobalt and nickel. In another embodiment, the gate layer is formed by a CVD process and is composed of a single doped polysilicon layer, which may then be patterned to form control gates of the NVM transistor 226 and MOS transistors 214, 212.

Figure 2L:
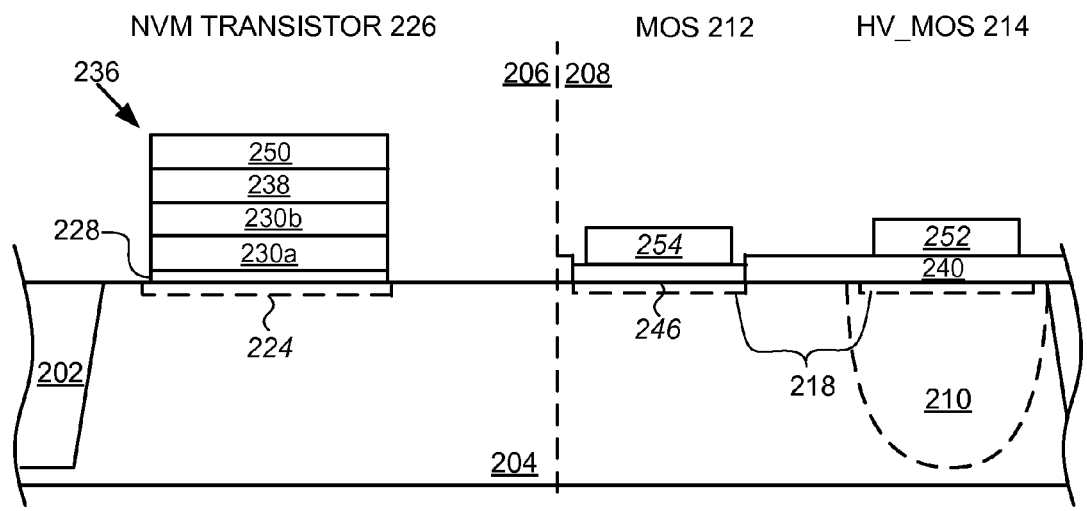
Figure 2M:
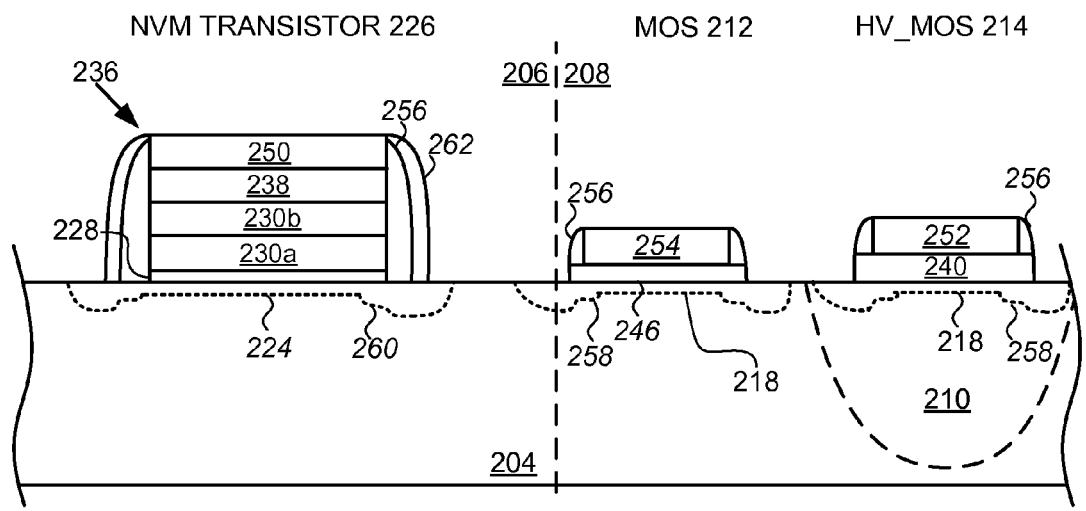

Referring to FIG. 2L, the gate layer 248 is patterned using a mask layer (not shown) and standard lithographic techniques to stop on surfaces of the blocking oxide layer 238, the first gate oxide 240 and the second gate oxide 246, thereby forming a gate 250 for the gate stack 236 of a NVM transistor 226, a gate 252 for the HV MOS transistor 214, and a gate 254 for the MOS transistor 212.

Referring to FIG. 1 and FIG. 2M, a first spacer layer is deposited and etched to form first sidewall spacers 256 adjacent to the gates 252, 254, of the MOS transistors 212, 214, and the NVM transistor 226, and one or more lightly-doped drain extensions (LDD 258) are implanted adjacent to and extend under sidewall spacers 256 of one or more of the MOS transistors 212, 214 (step 112).

Next, a SONOS LDD mask is formed over the substrate 204 and lightly-doped drain extensions (LDD 260) are implanted, adjacent to the NVM transistor 226. Finally, a second spacer layer is deposited and etched to form second sidewall spacers 262 adjacent to the gate stack 236, of the NVM transistor 226 (step 114).

Figure 2N:
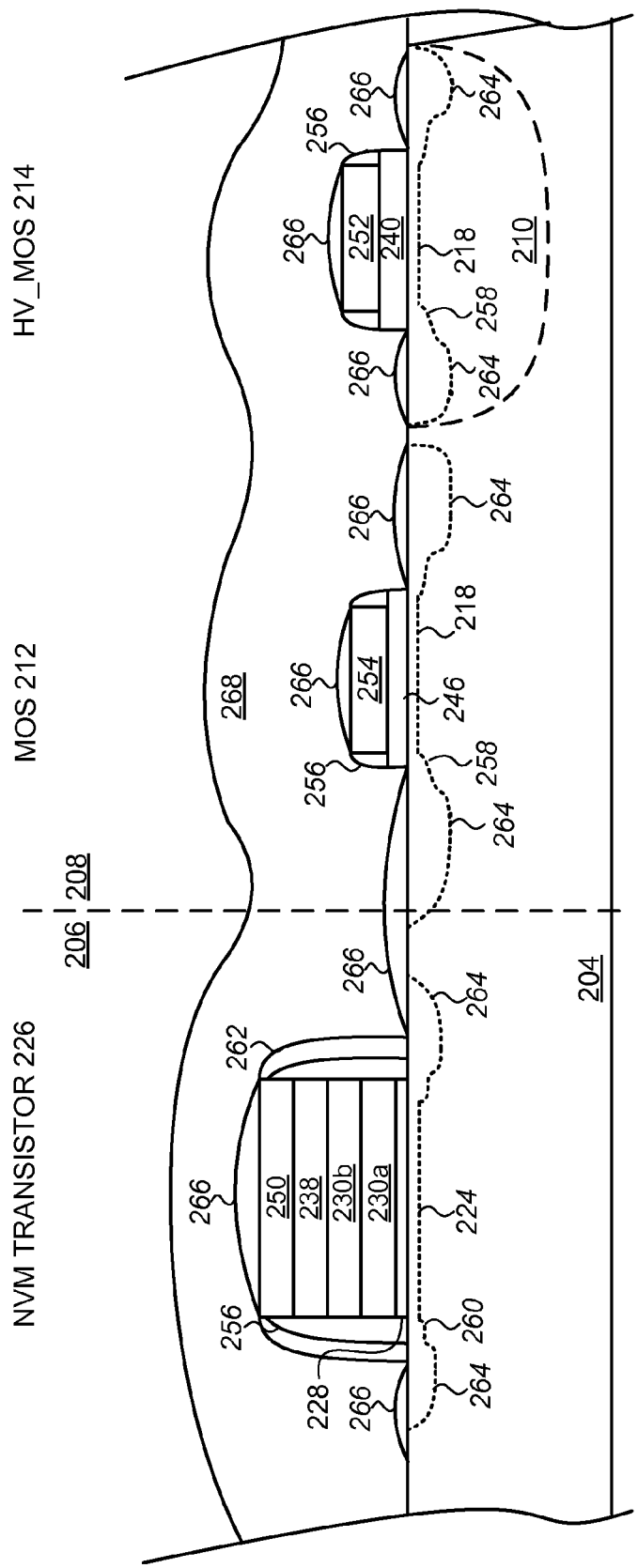
FIG. 2N is a block diagram illustrating a cross-sectional view of a portion of a finished memory cell including an embedded SONOS based NVM transistor and MOS transistors fabricated according to the method of FIGS. 1 and 2A-2M.

Referring to FIGS. 1 and 2N, with the NVM transistor 226, HV MOS transistor 214 and MOS transistor 212 substantially complete, source and drain implants are performed to form source and drain regions 264 for all transistors and a silicide process performed (step 116). As depicted, silicide regions 266 may be formed on the exposed gates 250, 252 and 254 and exposed source and drain regions 264. The silicide process may be any commonly employed in the art, typically including a pre-clean etch, cobalt or nickel metal deposition, anneal and wet strip.

Referring FIG. 1 and FIG. 2N, optionally the method of fabricating memory cells including an embedded or integrally formed SONOS based NVM transistor and MOS transistors further includes the step of forming a stress inducing layer or structure 268, such as a stress inducing nitride layer, over the gate stack 236 of the NVM transistor 226 to increase data retention and/or to improve programming time and efficiency (step 118). In particular, inducing stress into the charge-trapping layer 230 of the NVM transistor 226 changes energy levels of charge traps formed therein, thereby increasing charge retention of the charge-trapping layer. In addition, forming a stress inducing structure 268, in or on the surface 216 of the substrate 204 proximal to, and preferably surrounding, a region of the substrate in which the channel 224 of NVM transistor 226 is formed will reduce the band gap, and, depending on the type of strain, increases carrier mobility. For example, tensile strain, in which inter-atomic distances in the crystal lattice of the substrate 204 are stretched, increases the mobility of electrons, making N-type transistors faster. Compressive strain, in which those distances are shortened, produces a similar effect in P-type transistors by increasing the mobility of holes. Both of these strain induced factors, i.e., reduced band gap and increased carrier mobility, will result in faster and more efficient programming of NVM transistor 226.

The strain inducing structure 268 can include a pre-metal dielectric (PMD) layer formed using a High Aspect Ratio Process (HARP™) oxidation process, a compressive or tensile nitride layer formed using a plasma enhanced chemical vapor deposition (PECVD) or a Bis-TertiaryButylAmino Silane (BTBAS) nitride layer.

In certain embodiments, such as that shown in FIG. 2N, the stress inducing structure 268 may also be formed over one or more of the MOS transistors to induce strain in the channel of the MOS transistor.

Finally, the standard or baseline CMOS process flow is continued to substantially complete the front end device fabrication (step 120), yielding the structure shown in FIG. 2N. FIG. 2N is a block diagram illustrating a cross-sectional view of a portion of a finished memory cell including an embedded SONOS based NVM transistor and MOS transistors fabricated according to the method of FIGS. 1 and 2A-2M.

Figure 3A:
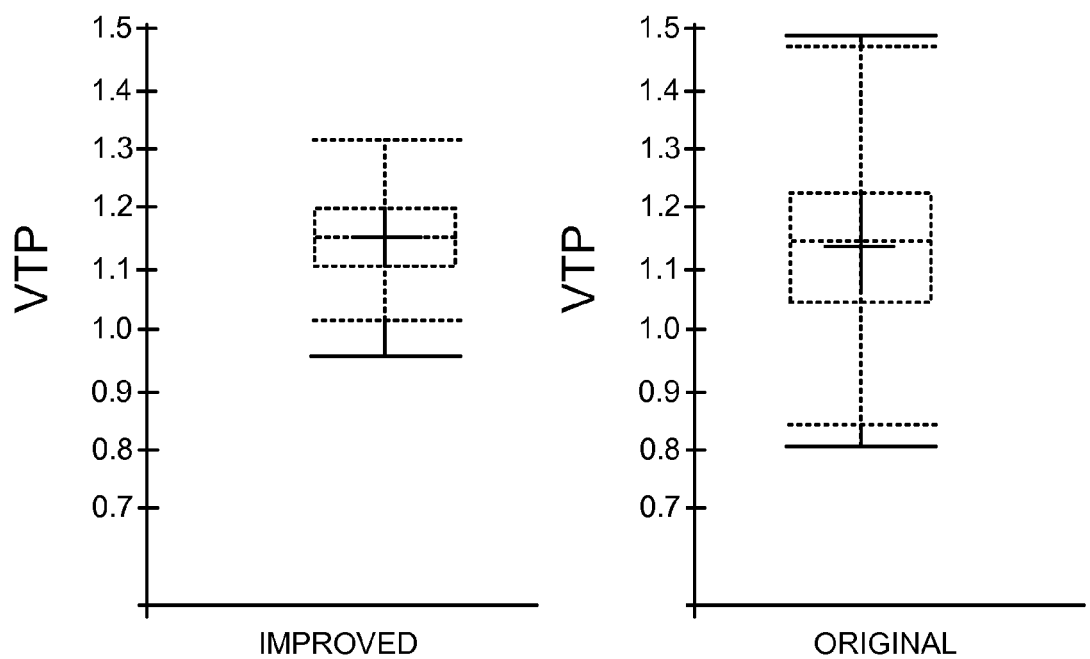
FIGS. 3A and 3B are graphs illustrating improvements in threshold voltage ($V_T$) uniformity of an NVM transistor including an indium channel according to an embodiment of the present disclosure.
Figure 3B:
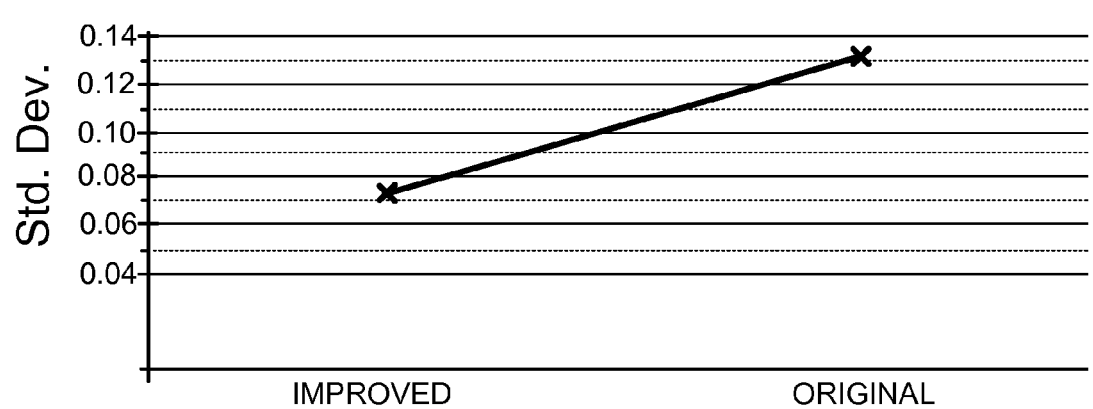

FIGS. 3A and 3B are graphs illustrating improvements in threshold voltage ($V_T$) uniformity of an NVM transistor including an indium channel according to an embodiment of the present disclosure. Referring FIGS. 3A and 3B it is noted that the heavier Indium atom does not move or diffuse as much as a light Boron atoms used in prior n-channel SONOS based NVM transistors, in the subsequent high temperature steps and hence the random dopant effects are reduced, significantly improving the $V_T$ uniformity from a sigma of $V_T$ from ~150 mV to ~70 to 80 mV.

Figure 4A:
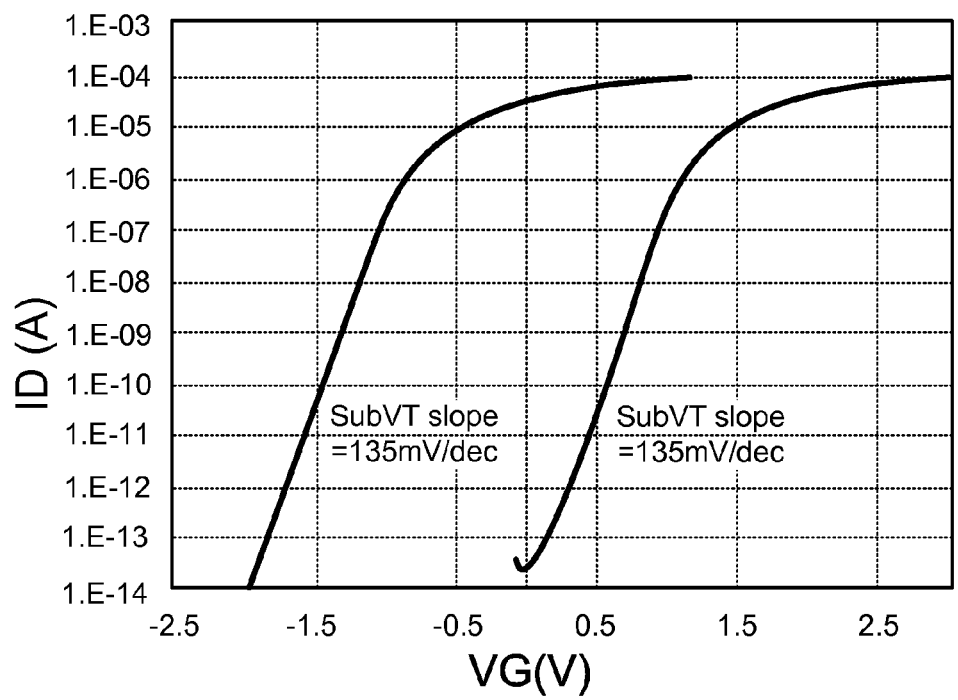
FIGS. 4A-4C are graphs illustrating basic program erase characteristics and showing improvements in endurance data retention for a memory device including an embedded SONOS based NVM transistor fabricated according to an embodiment of the present disclosure.
Figure 4B:
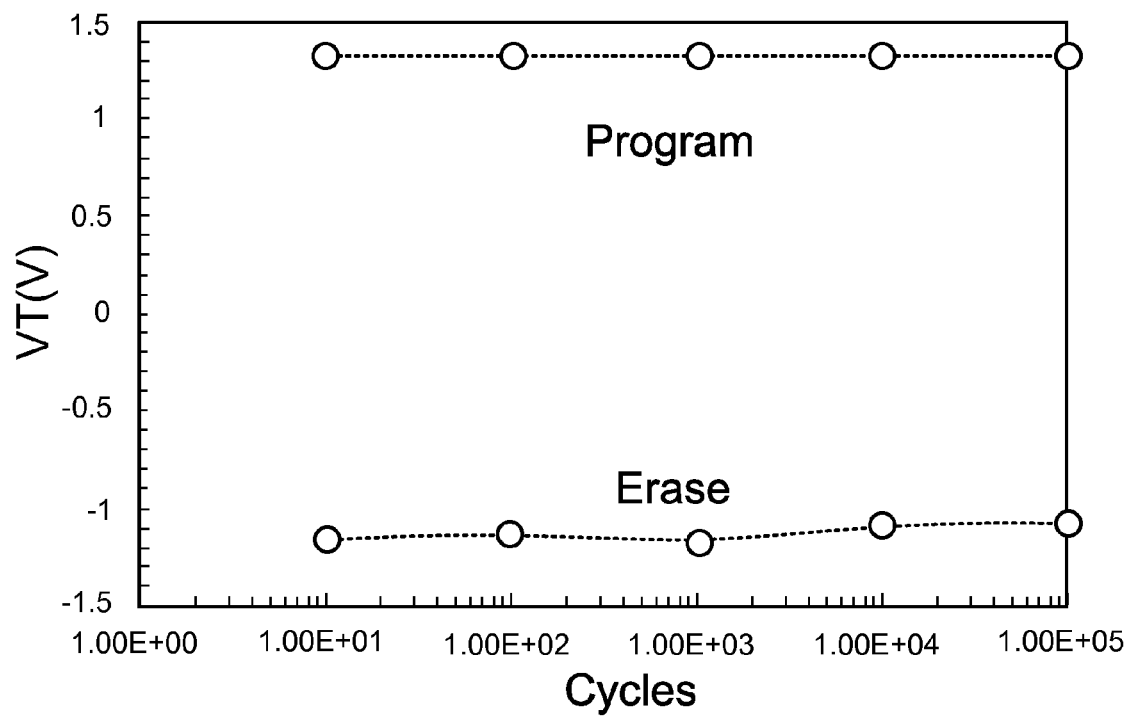
Figure 4C:
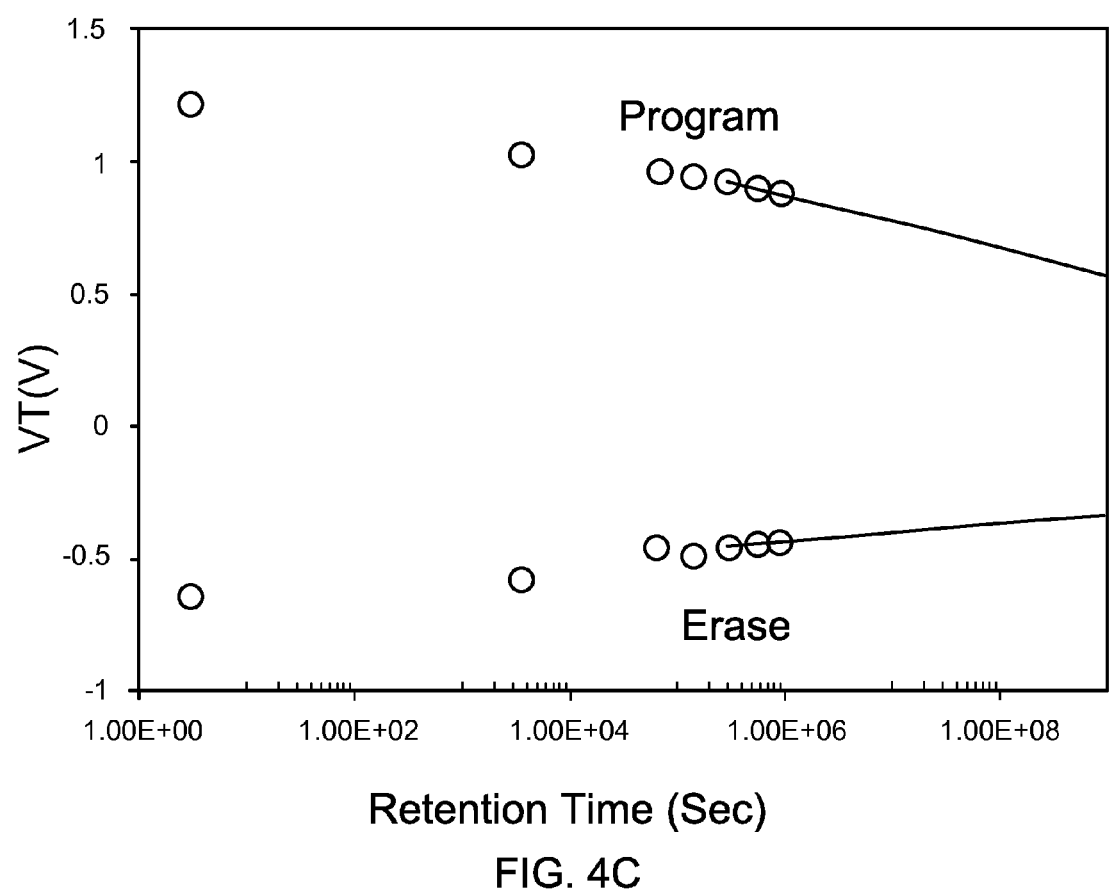

FIGS. 4A-4C are graphs illustrating basic program erase characteristics and showing improvements in endurance and data retention for a memory device including an embedded SONOS based NVM transistor fabricated according to an embodiment of the present disclosure. In particular, FIG. 4A shows subthreshold characteristics of the SONOS based NVM transistor in both the programmed and erased states. This figure shows a good subthreshold slope of about 135 mV is achieved using Indium implant which is one of the embodiments of the present disclosure.

FIG. 4B shows the cycling endurance of the SONOS NVM transistor fabricated according to an embodiment of the process described previously. It can be seen from FIG. 4B that there is no significant change in threshold voltage ($V_T$) on either program or erase after 100 thousand program and erase (P/E) cycles.

FIG. 4C shows the data retention charge loss for SONOS based NVM transistor fabricated according to an embodiment of the present disclosure. Referring to FIG. 4C, the $V_T$ window, i.e., a difference between the threshold voltage in programmed and erased states, is seen to be greater than 1V, which gives sufficient margin for error-free read even after 10 years or 3E8 seconds.

Thus, embodiments of memory cells including embedded or integrally formed SONOS based NVM transistor and MOS transistors and methods of fabricating the same have been described. Although the present disclosure has been described with reference to specific exemplary embodiments, it will be evident that various modifications and changes may be made to these embodiments without departing from the broader spirit and scope of the disclosure. Accordingly, the specification and drawings are to be regarded in an illustrative rather than a restrictive sense.

The Abstract of the Disclosure is provided to comply with 37 C.F.R. §1.72(b), requiring an abstract that will allow the reader to quickly ascertain the nature of one or more embodiments of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

Reference in the description to one embodiment or an embodiment means that a particular feature, structure, or characteristic described in connection with the embodiment is included in at least one embodiment of the circuit or method. The appearances of the phrase one embodiment in various places in the specification do not necessarily all refer to the same embodiment.

What is claimed is:

1. A device, comprising:
   a non-volatile memory (NVM) transistor formed in a first region of a substrate, the NVM transistor comprising a channel and a gate stack on the substrate overlying the channel, the gate stack including a dielectric layer on the substrate and a charge-trapping layer on the dielectric layer and an oxide layer overlying the chargetrapping layer, a first gate overlying the oxide layer, and a first silicide region overlying the first gate;
   a metal-oxide-semiconductor (MOS) transistor formed in a second region of the substrate, the MOS transistor comprising a gate oxide overlying the substrate in the second region, a second gate overlying the gate oxide, and a second silicide region overlying the second gate; and
   a strain inducing structure overlying the NVM transistor and a surface of the substrate in the first region of the substrate.

2. The device of claim 1, wherein the strain inducing structure comprises a compressive dielectric layer.

3. The device of claim 2, wherein at least one of the NVM transistor or the MOS transistor comprises a p-channel transistor.

4. The device of claim 1, wherein the strain inducing structure comprises a tensile dielectric layer.

5. The device of claim 4, wherein at least one of the NVM transistor or the MOS transistor comprises an n-channel transistor.

6. The device of claim 1, wherein the channel of the NVM transistor comprises an indium doped channel.

7. The device of claim 1, wherein the strain inducing structure surrounds the gate stack, increasing charge retention of the charge-trapping layer.

8. The device of claim 1, wherein the strain inducing structure surrounds the first region of the substrate in which the channel is formed, reducing the band gap and increasing carrier mobility of the NVM transistor.

9. A device, comprising:
   a NVM transistor formed in a first region of a substrate including a gate stack overlying a channel, a first gate overlying the gate stack, and a first silicide region overlying the first gate, wherein the gate stack includes a charge-trapping layer sandwiched between a top and a bottom dielectric layers;
   a MOS transistor pair formed in a second region of the substrate, wherein each of the MOS transistors includes a gate oxide overlying the substrate a second gate overlying the gate oxide, and a second silicide region overlying the second gate of each of the MOS transistors; and
   a strain inducing structure overlying the NVM transistor, the MOS transistors and surfaces of the substrate in the first and second regions of the substrate.

10. The device of claim 9, wherein the strain inducing structure comprises a compressive dielectric layer in direct contact with the first and second silicide regions.

11. The device of claim 10, wherein at least one of the NVM transistor or the MOS transistors comprises a p-channel transistor.

12. The device of claim 9, wherein the strain inducing structure comprises a tensile dielectric layer in direct contact with the first and second silicide regions.

13. The device of claim 12, wherein at least one of the NVM transistor or the MOS transistors comprises an n-channel transistor.

14. The device of claim 9, wherein the channel of the NVM transistor comprises an indium doped channel.

15. A memory cell, comprising:
    a Silicon-Oxide-Nitride-Oxide-Silicon (SONOS) transistor formed in a first region of a substrate, the SONOS transistor comprising a channel and a gate stack on the substrate overlying the channel a first gate and a first silicide region overlying the gate stack, the gate stack including a dielectric layer on the substrate, a lower and an upper charge-trapping layers on the dielectric layer, and an oxide layer overlying the upper charge-trapping layer;
    at least one metal-oxide-semiconductor (MOS) transistor formed in a second region of the substrate, each of the at least one MOS transistor comprising a gate oxide overlying the substrate, a second gate and a second silicide region overlying the gate oxide in the second region; and
    a strain inducing structure formed at least directly over and in direct contact with the first silicide region of the SONOS transistor and the second silicide region of each of the at least one MOS transistor.

16. The device of claim 15, wherein the strain inducing structure comprises a compressive dielectric layer in direct contact with the first and second silicide regions.

17. The device of claim 16, wherein at least one of the SONOS transistor or the MOS transistor comprises a p-channel transistor.

18. The device of claim 15, wherein the strain inducing structure comprises a tensile dielectric layer in direct contact with the first and second silicide regions.

19. The device of claim 18, wherein at least one of the SONOS transistor or the MOS transistor comprises an n-channel transistor.

20. The device of claim 15, wherein the channel of the SONOS transistor comprises an indium doped channel.

* * * * *